(12) United States Patent
Nadal et al.

(10) Patent No.: US 10,230,547 B2
(45) Date of Patent: Mar. 12, 2019

(54) FILTER FOR LINEAR MODULATION BASED COMMUNICATION SYSTEMS

(71) Applicant: INSTITUT MINES-TELECOM / TELECOM BRETAGNE, Brest (FR)

(72) Inventors: Jérémy Nadal, Brest (FR); Charbel Abdel Nour, Brest (FR); Amer Baghdadi, Brest (FR)

(73) Assignee: INSTITUT MINES-TELECOM / TELECOM BRETAGNE, Brest (FR)

( * ) Notice: Subject to any disclaimer, the term of this patent is extended or adjusted under 35 U.S.C. 154(b) by 0 days.

(21) Appl. No.: 15/492,028

(22) Filed: Apr. 20, 2017

(65) Prior Publication Data
US 2017/0310505 A1  Oct. 26, 2017

(30) Foreign Application Priority Data
Apr. 21, 2016 (EP) .................................... 16305462

(51) Int. Cl.
*H04L 25/02* (2006.01)
*H04L 25/03* (2006.01)
(Continued)

(52) U.S. Cl.
CPC ..... *H04L 25/0212* (2013.01); *H03H 17/0248* (2013.01); *H04L 25/022* (2013.01);
(Continued)

(58) Field of Classification Search
CPC . H03H 17/02; H04B 1/16; H04B 1/71; H04B 7/06; H04L 5/00; H04L 25/02; H04L 25/03; H04L 25/0212; H04L 25/03159; H04L 25/03821; H04L 27/01; H04L 27/26; H04L 27/28; H04L 27/264; H04L 27/265; H04L 27/2698
(Continued)

(56) References Cited

U.S. PATENT DOCUMENTS

| 9,673,949 B2* | 6/2017 | Kim ...................... H04L 27/264 |
| 2012/0243625 A1* | 9/2012 | Berg ..................... H04L 25/022 375/260 |

(Continued)

OTHER PUBLICATIONS

A. Sahin et al. "A Survey on Multicarrier Communications: Prototype filters, lattice structures and implementation aspects", IEEE communications surveys & Tutorials, vol. 16, No. 3, pp. 1312-1338, 2014.

(Continued)

*Primary Examiner* — Shawkat M Ali
(74) *Attorney, Agent, or Firm* — Meagher Emanuel Laks Golberg & Liao, LLP

(57) ABSTRACT

A method of designing a digital filter for example for use in an FBMC/OQAM telecommunications system, with a target overlapping factor and meeting a specified signal to interference ratio is described, whereby a candidate filter design defined by an impulse response, satisfying the Nyquist criterion and having an overlapping factor higher than the target is selected, and the time and frequency coefficients of its impulse response inverted to define a new filter design; and
truncating the impulse response defining said new filter design to the minimum number of coefficients achieving said specified signal to interference ratio.

15 Claims, 4 Drawing Sheets

(51) Int. Cl.
*H04L 27/26* (2006.01)
*H03H 17/02* (2006.01)
*H03H 17/00* (2006.01)

(52) U.S. Cl.
CPC .. *H04L 25/03159* (2013.01); *H04L 25/03821* (2013.01); *H04L 27/264* (2013.01); *H04L 27/2698* (2013.01); *H03H 2017/0072* (2013.01); *H04L 2025/0342* (2013.01); *H04L 2025/03522* (2013.01)

(58) Field of Classification Search
USPC .................................. 375/232, 260, 261, 375
See application file for complete search history.

(56) References Cited

U.S. PATENT DOCUMENTS

| | | | | |
|---|---|---|---|---|
| 2014/0286384 A1* | 9/2014 | Mestre Pons | ........... | H04L 27/01 375/232 |
| 2015/0146770 A1* | 5/2015 | Dore | ................. | H04L 25/0204 375/232 |
| 2016/0211998 A1* | 7/2016 | Sun | ..................... | H04L 27/264 |

OTHER PUBLICATIONS http://www.ictphydyas.org/.
K. Martin, "Small side-lobe filter design for multitone data-communication applications," IEEE Transactions on Circuits and Systems II: Analog and Digital Signal Processing, vol. 45, No. 8, pp. 1155-1161, Aug. 1998.
D. Pinchon, P. Siohan, and C. Siclet, "Design techniques for orthogonal Modulated filterbanks based on a compact representation," IEEE Transactions on Signal Processing, vol. 52, No. 6, pp. 1682-1692, Jun. 2004.
B. le Floch, M. Alard, C. Berrou. In "Coded orthogonal frequency division multiplex". Proceedings of the IEEE, vol. 83, pp. 982-996, Jun. 1995.
European Search Report for 16305462.0 dated Oct. 13, 2016.
Maurice Bellanger: "FS-FBMC: An alternative scheme for filter bank based multicarrier transmission", Communications Control and Signal Processing (ISCCSP), 2012 5th International Symposium ON, IEEE, May 2, 2012 (May 2, 2012), pp. 1-4.
M Bellanger et al: "FBMC Physical Layer: a Primer", May 27, 2010 (May 27, 2010), pp. 1-31.

* cited by examiner

FILTER FOR LINEAR MODULATION BASED COMMUNICATION SYSTEMS

FIELD OF THE INVENTION

The present invention relates to filters for linear modulation based communication systems, and their design.

BACKGROUND OF THE INVENTION

Forthcoming mobile communication systems are foreseen to provide ubiquitous connectivity and seamless service delivery in all circumstances. The large number of devices and the coexistence of human-centric and machine type applications expected will lead to a large diversity of communication scenarios and characteristics. In this context, many advanced communication techniques are under investigation. Each of these techniques is typically suitable for a subset of the foreseen communication scenarios.

One category of techniques is based on filter-bank multicarrier communications principles. A filter-bank multicarrier (FBMC) communications system is composed of a synthesis filter for the modulation and an analysis filter for demodulation. The synthesis and analysis filters are composed of M channels, denoted by sub-carriers for a communications system. The channel number m of the synthesis filter modulates a complex signal $c_n(m)$ carrying information at time slot n. This channel consists of an oversampling operation by N followed by a finite impulse response filter $F_m(z)$. These operations can be expressed as follows:

Upsampling by N (1)
$$C_{\uparrow N,k}(m) = \begin{cases} C_{\frac{k}{N}}(m) & \text{if } \mathrm{mod}_N(kN) = 0 \\ 0 \end{cases}$$

Filter by $F_m(z)$ (2)
$$s_m(k) = \sum_{l=-\infty}^{+\infty} C_{\uparrow N,k-l}(m) f_m(l)$$

$$f_m(l) = g(l) e^{\frac{i2\pi lm}{M}} \quad (3)$$

g is called the prototype filter, and is a function with a finite length
$$L: g(k) = 0 \text{ if } k \notin [\![ 0, L-1 ]\!]. \quad (4)$$

The modulated signal s(k) at the output of the synthesis filter is obtained after the sum of each channel output:

$$s(k) = \sum_{m=0}^{M-1} s_m(k) \quad (5)$$

An equivalent relation between the input and output signal of the synthesis filter can be expressed as follows:

$$s(k) = \sum_{m=0}^{M-1} \sum_{n=-\infty}^{+\infty} c_n(m) g(k-nN) e^{\frac{i2\pi km}{M}} \quad (6)$$

This expression leads to the polyphase network representation of the synthesis filter, which is computationally complex to implement when compared to a direct synthesis filter representation.

Concerning the analysis filter, the dual operations of the transmitter for the M channels are comprised of the following operation:

Filtering by $H_m(z)$: $r_m(k) = \sum_{l=-\infty}^{+\infty} r(k-1) h_m(l)$, $h_m(l) = g(l) e^{\frac{-i2\pi lm}{M}}$ (7)

Downsampling by N: $d_n(m) = r_m(nN)$ (8)

The equivalent relation between the input and output signals of the analysis filter can be expressed as follows:

$$d_n(m) = \sum_{k=-\infty}^{+\infty} s(k) g(k-nN) e^{\frac{-i2\pi km}{M}} \quad (9)$$

This basic approach is used in numerous modulation schemes, and as such the design of filters implementing the described approach is an important activity.

This definition of the FBMC technique corresponds to numerous modulation schemes depending on the design of the underlined prototype filters and the choice of the different set of parameters (M, N, L, . . . ). One such modulation scheme is Filter-Bank Multi-Carrier with Offset Quadrature Amplitude Modulation (FBMC/OQAM) which is being studied and considered as a key enabler for the future flexible 5G air interface for example. It exhibits better spectrum shape compared to the traditional Orthogonal Frequency-Division Multiplexing (OFDM) and enables better spectrum usage and improved mobility support. This is possible thanks to the use of a prototype filter which makes it possible to improve the time and frequency localization properties of the transceiver. Orthogonality is preserved in the real field with the OQAM scheme. FBMC/OQAM implementation is not different from OFDM as it relies on Fast Fourier Transform (FFT) processing with an additional low-complexity PolyPhase Network (PPN) filtering stage. However, the choice of the prototype filter is crucial for FBMC/OQAM modulation, as the time/frequency localization of this filter can significantly impact the different performance levels and the frame structure of the communication system. Furthermore, the length of the prototype filter impacts considerably the receiver complexity. Thus, design of new filters is of high interest to improve robustness of FBMC/OQAM against channel impairments and to support the constraints imposed by various 5G scenarios while preserving reasonable receiver complexity.

FBMC is a multicarrier transmission scheme that introduces a filter-bank to enable efficient pulse shaping for the signal conveyed on each individual subcarrier. This additional element represents an array of band-pass filters that separate the input signal into multiple components or subcarriers, each one carrying a single frequency sub-band of the original signal. The process of decomposition performed by the filter bank is called analysis (meaning analysis of the signal in terms of its components in each sub-band); the output of analysis is referred to as a sub-band signal with as many sub-bands as there are filters in the filter bank. The reconstruction process is called synthesis, meaning reconstitution of a complete signal resulting from the filtering process. Such a transceiver structure usually requires a higher implementation complexity related not only to the filtering steps but also to the applied modifications to the modulator/demodulator architecture. However, the usage of digital polyphase filter bank structures together with the rapid growth of digital processing capabilities in recent years have made FBMC a practically feasible approach. As a promising variant of filtered modulation schemes, FBMC/OQAM, (also called OFDM/OQAM or staggered modulated multitone—SMT), can usually achieve a higher spectral efficiency than OFDM since it does not require the insertion of a Cyclic-Prefix (CP). Additional advantages include the robustness against highly variant fading channel conditions and imperfect synchronizations by selecting the appropriate prototype filter type and coefficients. 4G/LTE is based on OFDM multicarrier modulation. In accordance with the Balian-Low theorem, OFDM:

1) respects the complex orthogonality,
2) is poorly localized in frequency domain by adopting a rectangular waveform,
3) wastes part of the available bandwidth due to the addition of a CP.

Property 2 results in high Out-Of-Band Power Leakage (OOBPL), and large guard-bands have to be inserted to respect Adjacent Channel Leakage Power Ratio (ACLR) requirements. Furthermore, it results in a poor robustness against Doppler shift and spread. Further possible disadvantages of the corresponding OFDM system are related to flexible spectrum usage scenarios, where spectrum sharing and fragmented usage are not efficiently supported.

To overcome the shortcomings 2) and 3) of OFDM, FBMC/OQAM:

a) relaxes to real field orthogonality,
b) is better localized in time and frequency, depending on the used prototype filter,
c) uses efficiently available bandwidth to achieve a higher spectral efficiency.

Property a) is obtained by changing the way QAM symbols are mapped onto each subcarrier. Instead of sending a complex symbol (I and Q) of duration T as in classical CP-OFDM, the real and imaginary parts are separated and sent with an offset of T/2 (hence the name Offset-QAM). Improvement b) comes from the introduction of the filterbank and therefore highly depends on its type and coefficients. Property c) is the consequence of the absence of a CP. Previous published works have identified two major design criteria for an FBMC/OQAM system:

Time Frequency Localization (TFL) criterion: for a better localized waveform in time and frequency domains thanks to the prototype filter. It is predictable that FBMC systems exhibit better robustness than CP-OFDM in doubly-dispersive channels and in the case of communications with synchronization errors, as described in "A survey on multicarrier communications: Prototype filters, lattice structures and implementation aspects", A. Sahin et al., IEEE communications surveys & Tutorials, vol. 16, No 3, pp 1312-1338, 2014. To this purpose filter designs with the optimized TFL criterion have been proposed, such as Isotropic Orthogonal Transform Algorithm with overlapping factor (OF) equals to 4.

Lower sideband criterion: for achieving low out-of-band power leakage in frequency domain and for improving spectrum coexistence with other systems. To this purpose, particular filter types should be used such as Martin-Mirabassi-Bellange with OF equals to 4, as considered for FBMC/OQAM during the PHYDYAS project, as described at http://www.ict-phydyas.org/.

FBMC/OQAM System Description

Two basic implementation approaches for the FBMC/OQAM modulation exist, each having different characteristics in terms of computational or hardware complexity and performance.

FIG. 1 shows a PPN FBMC/OQAM transmitter implementation.

As shown, the implementation of FIG. 1 comprises an OQAM mapper 110 comprising a QAM mapper 111 creating real and imaginary values from a binary input. The imaginary values are delayed by T/2 with respect to the real values by delay unit 112. The real and imaginary values are output to respective processing channels. Each processing channel comprises in sequence a preprocessing unit 121, 122, an Inverse Fast Fourier Transform (IFFT) unit 131, 132 and a Polyphase Network (PPN) 141, 142. The outputs of the two processing channels are then combined by a summer 150.

In operation, a Pulse-amplitude modulation (PAM) symbol at subcarrier index m and time slot n, $a_n(m)$ is obtained from the QAM mapper 111 equivalent to OFDM, where M is the total number of available sub-carriers and $N_s$ the number of FBMC symbols with separation of real and imaginary parts respectively at time slots 2n and 2n+1.

Pre-processing unit 121, 122 computes the phase term $\phi n(m)$, which to keep the orthogonality in the real field must be a quadrature phase rotation term, i.e.

$\phi_n(m) = j^{n+m}$, or $\phi_n(m) = j^{n+m-n\,m}$.

The outputs of two Inverse Fast Fourier Transform (IFFT) blocks 131, 132 separately process the real and imaginary sub-carriers in accordance with the equation:

$$u_n(k) = \sum_{m=0}^{M-1} a_n(m)\phi_n(m)e^{j\frac{2\pi}{M}km} \quad (10)$$

The Polyphase Network (PPN) 141, 142 corresponds in effect to a bank of phase shifters providing a respective phase shift for each sub-carrier. Specifically, the Polyphase Network filter decomposition is described as follows:

$$s_l(k) = \sum_{n=0}^{N_a-1} g(k-nM)u_{2n+1}(k) \quad (11)$$

The PPN 141, 142 can be seen as a digital filter, whose design represents important trade-offs between performance and system complexity and the final overlap and sum due to OQAM processing.

$$s_l(k) = s_0(k) + s_1\left(k - \frac{M}{2}\right) \quad (12)$$

When using a short filter with an Overlapping Factor of 1 for the PPN, this latter can be seen as a windowing operation: the outputs of the IFFT are simply multiplied by the prototype filter impulse response. Consequently, the hardware complexity overhead introduced by the PPN is limited.

Secondly, a Frequency Spread (FS) implementation is possible.

FIG. 2a shows an FS FBMC/OQAM transmitter implementation. As shown, the implementation of FIG. 2 comprises an OQAM mapper 210 comprising a QAM mapper 211 creating real and imaginary values from a binary input.

The imaginary values are delayed by T/2 with respect to the real values by delay unit 212. The real and imaginary values are output to respective processing channels. Each processing channel comprises in sequence a preprocessing unit 221, 222, an upsampling unit 231, 232, which upscale each signal by a factor of q, a Finite Impulse Response (FIR) filter 241, 242 and an Inverse Fast Fourier Transform block 251, 252. The outputs of the two processing channels are then combined by a summer 260.

The original concept of this design is to shift the filtering stage into the frequency domain, to enable the use of a low-complexity per-sub-carrier equalizer as in OFDM. The hardware complexity is supposed to be higher than the complexity of the PPN implementation, at least for long filters. In fact, it requires one FFT of size L=qM per OQAM symbol, where q is the overlapping factor, and M the total number of available sub-carriers. However, in the case of a short filter (q=1), the size of the FFT is the same as for the PPN implementation.

FIG. 2b shows an FS FBMC/OQAM Receiver implementation. As shown, a received signal is sampled by a first sliding window 263. The received signal is furthermore subjected to a M/2 delay by delay unit 270, where M is the length of the first sliding window 263 and also a second sliding window 264 to which the output of the delay unit 270 is fed, so that the sampled periods of the two sliding windows 263, 264 overlap by half their respective lengths. Each Sliding window 263, 264 outputs samples to respective Fast Fourier Transform units 253, 254. Fast Fourier Transform units 253, 254 provide their outputs to respective Digital Filters 243, 244, the outputs of which are then down sampled by downsampling units 233, 234 which down sample by a factor of q. The outputs of the downsampling units 233, 234 are processed in respective post processing units 223, 224, and then finally the real components are mapped back to recover the original data by the QAM demapper 281.

Typical FBMC/OQAM architectures use a prototype filter with a duration 4 times higher than an OFDM symbol. However, a shorter filter can also be applied, such as the Quadrature Mirror Filter with OF equal to 1 which was recently applied to FBMC/OQAM leading to a variant denoted by Lapped-OFDM modulation.

It is desirable to find short prototype filter designs with good performance and low hardware complexity, and methodologies for developing such designs.

SUMMARY OF THE INVENTION

According to a first aspect, there is provided a method of designing a digital filter with a target overlapping factor meeting a specified signal to interference ratio. This method comprises the steps of: selecting a candidate filter design defined by a filter bank impulse response, satisfying the Nyquist criterion and having an overlapping factor higher than the target; inverting the time and frequency coefficients of the filter bank impulse response to define a further filter design; and truncating the frequency response defining the further filter design to the minimum number of coefficients achieving said specified signal to interference ratio.

This approach thus provides an automated mechanism for obtaining a filter design with desirable characteristics of whatever short length may be specified, in particular when compared to longer filters known in the prior art, whilst still achieving SIR objectives. The resulting filter shows the following advantages:

Transition between two successive radio frames due to the filter convolution is shortened, increasing the spectral efficiency of the transmission. The overhead is only of M/2 samples for a filter with an overlapping factor of 1, compared to 7M/2 for typical long filters.

By consequence, latency is greatly reduced. This is a critical performance indicator, in particular for 5G networks currently under specification. Some applications, like vehicle to vehicle communication, will require less than 1 millisecond of end to end latency, in particular for security purposes.

High resilience to Carrier Frequency Offset (CFO) introduced by Doppler shift and spread, or misalignment of the local oscillator between the transmitter(s) and the receiver which results in CFO impairment. In 5G, the transceiver has to support mobility up to 500 km/h, 200 km/h higher than in 4G/LTE. Thus, the sensitivity to Doppler shift and CFO is a critical issue and OFDM using 4G/LTE parameters cannot easily support such mobility requirements.

The hardware complexity is highly reduced, particularly in terms of memory requirements. At the transmitter side, an optimization of the FBMC/OQAM modulator is possible and provides a hardware complexity comparable to OFDM.

Space-Time Block Coding (STBC) Multiple Input Multiple Output (MIMO) diversity scheme can be applied with minimal spectral efficiency loss when using the block-type implementation, due to a shorter block transition.

Peak to Average Power Ratio (PAPR) reduction techniques are more efficient.

In a development of the first aspect, the step of selecting a candidate filter further comprises selecting a candidate filter design defined in terms of a filter bank impulse response having a finite number of frequency coefficients having a value greater that $1 \times 10^{-2}$ when projected on a time and frequency grid with half symbol period and subcarrier spacing as time and frequency components respectively.

Selecting a candidate filter with a specified number of near zero coefficients causes the resulting time response after inversion to demonstrate near optimum time localization. Setting an empirical limit below a value (that may be equated to zero) of $1 \times 10^{-2}$, ensures that non-zero values that are so small as to still permit this effect, are still considered.

In a development of the first aspect, the candidate prototype filter design is the "Martin-Mirabassi-Bellange" design with an overlapping factor of 3 to 8 inclusive.

Using this known filter design as a starting point provides a digital filter offering good performance in line with the advantages set out above without the need for developing and testing new candidate filters.

In a development of the first aspect, the step of defining a candidate prototype filter comprises using either the Isotropic Orthogonal Transform Algorithm or the Square Root Raised Cosine functions.

Using these known filter design techniques provides a more complete workflow for developing a digital filter having the desired characteristics and offering the advantages described above from scratch.

In a development of the first aspect, the step of defining a candidate prototype filter comprises weighted-sum of near-adjacent IFT filters.

Using these known filter design techniques provides a more complete workflow for developing a digital filter having the desired characteristics and offering the advantages described above from scratch.

In a development of the first aspect, the step of defining a candidate prototype filter comprises using a compact representation by decomposing the impulse response of the filter into an angular-based representation of the corresponding polyphase network.

Using these known filter design techniques provides a more complete workflow for developing a digital filter having the desired characteristics and offering the advantages described above from scratch.

In a development of the first aspect, the target overlapping factor of the digital filter is larger than 1.

Filters with an overlapping factor greater than one may still provide acceptable results, whilst expanding the set of candidate filters that may be considered as starting points.

In a development of the first aspect, the candidate filter design has 3 frequency coefficients having a value greater that $1 \times 10^{-2}$.

Limiting the initial selection of candidate filters to those having 3 non-zero frequency coefficients gives optimal prospects of achieving the stated target characteristics in the final digital filter, albeit at the cost of excluding many possible candidate filters.

In a development of the first aspect, the candidate filter design has 5 frequency coefficients having a value greater that $1 \times 10^{-2}$.

Limiting the initial selection of candidate filters to those having 5 non-zero frequency coefficients gives fair prospects of achieving the stated target characteristics in the final digital filter, whilst excluding fewer possible candidate filters.

According to a second aspect, there is provided a digital filter with a specified overlapping factor and meeting a specified signal to interference ratio, said filter being defined by the method of the first aspect.

Such a filter has the same advantages as ascribed to the first aspect.

According to a third aspect, there is provided a digital filter with a target overlapping factor and meeting a specified signal to interference ratio, said filter being defined by a truncation of the coefficients of the inverted time and frequency coefficients of the filter bank impulse response defining a candidate filter design satisfying the Nyquist criterion and having an overlapping factor higher than the target.

Such a filter has the same advantages as ascribed to the first aspect.

According to a fourth aspect, there is provided a transmitter implementing cyclic or linear convolution using the digital filter of the second or third aspects.

In a development of the fourth aspect, the transmitter implements an FBMC/OQAM modulation.

A transmitter side optimization of the FBMC/OQAM modulator is possible and provides a hardware complexity comparable to OFDM.

According to a fifth aspect, there is provided a receiver implementing cyclic or linear convolution using the digital filter of the second or third aspects.

In a development of the fifth aspect, the receiver implements an FBMC/OQAM demodulation.

BRIEF DESCRIPTION OF THE DRAWINGS

The above and other advantages of the present invention will now be described with reference to the accompanying drawings, in which.

DETAILED DESCRIPTION

Figure 3:
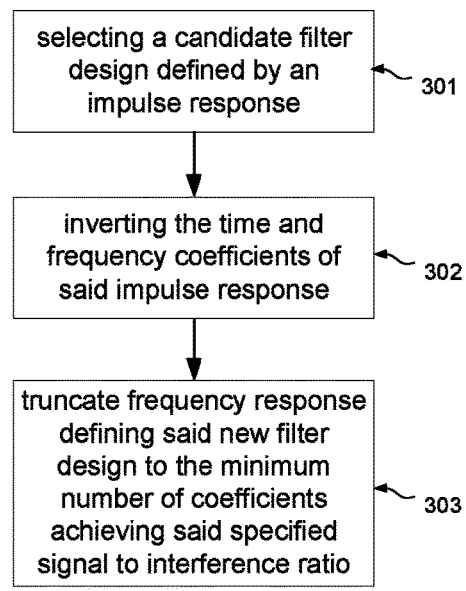
FIG. 3 shows a method of designing a digital filter with a low overlapping factor meeting a specified signal to interference ratio.

FIG. 3 shows a method of designing a digital filter with a low overlapping factor meeting a specified signal to interference ratio.

Overlapping Factor (OF) is defined by the number of FBMC symbols which overlap, plus 1. It is also equal to the length of the filter (L) divided by the maximum number of sub-carrier (=DFT size) in a polyphase representation of the filter-bank:

$$OF = L/M. \tag{13}$$

For a practical communication system, having a low OF is advantageous since it decreases the hardware complexity and the latency of the resulting transceiver thanks to the short filter duration. The overlap operation due to the OQAM processing is however not counted. FBMC/OQAM is equivalent to FBMC/PAM with doubled OF value.

As shown in FIG. 3, the method starts at step 301, at which a candidate filter design defined by a filter bank impulse response and satisfying the Nyquist criterion is selected.

The Nyquist criterion describes the conditions which, when satisfied by a communication channel (including responses of transmit and receive filters), results in no inter-symbol interference (ISI) and no inter-carrier interference.

If the discrete prototype filter impulse response is denoted as g(k), then the condition for an ISI-free response of the resulting filter-bank can be expressed as:

$$\sum_{i=-\infty}^{+\infty} g\left(k + i\frac{M}{2}\right) g\left(k + i\frac{M}{2} + nM\right) = \delta(n), \forall k \tag{14}$$

where M corresponds to the number of samples in a transmitted symbol of duration $T=MT_s$, $T_s$ being the sampling period. $\delta(n)$ denotes the Dirac function. This criterion can be intuitively understood as indicating that time-shifted replicas of $g^2(k)$ by half of the symbol duration (equivalent to $$\frac{M}{2}$$

samples) must add up to a constant value.

Figure 4A:
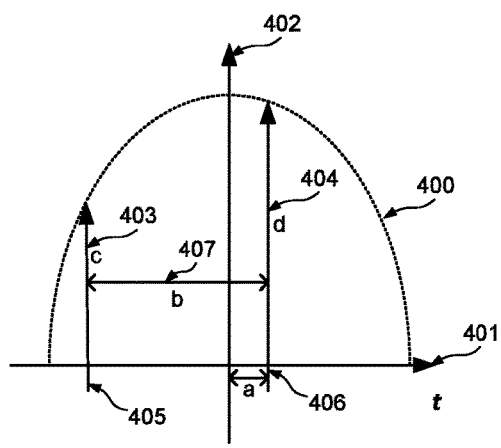
FIG. 4a illustrates the Nyquist criterion.

FIG. 4a illustrates the Nyquist criterion for a filter bank system. As shown in FIG. 4a, a prototype filter impulse response 400 is plotted, with time on the x axis 401 and power on the y axis 402. A first filter response 403 is plotted at a first time 405, and a second filter response 404 is plotted at a second time 406, the two time-shifted filter responses being separated by a time shift b, 407.

Figure 4B:
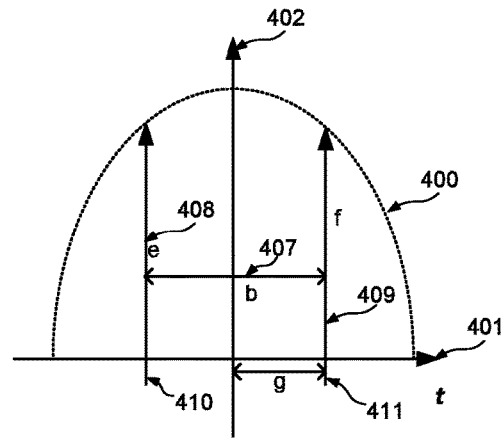
FIG. 4b further illustrates the Nyquist criterion.

FIG. 4*b* further illustrates the Nyquist criterion for a filter bank system. As shown in FIG. 4*b*, the prototype filter impulse response 400 of FIG. 4*a* is plotted, with time on the x axis 401 and power on the y axis 402. A first filter response 408 is plotted at a third time 410, and a fourth filter response 409 is plotted at a second time 411, the two time-shifted filter responses being separated by the same time shift b as for FIG. 4*a*, 407.

Although in FIGS. 4*a* and 4*b* the abscissa for the filter responses is different (a and g respectively), the total of the powers of the first and second filter responses c+d is equal to the total of the powers of the third and four filter responses e+f. For a prototype filter of a filter bank satisfying the Nyquist criterion, this will be true for any pair of filter responses shifted by the same interval of time.

The candidate prototype filter can be chosen from a set of defined functions such as square-root-raised-cosine or IOTA functions, or selected from the substantial pool of existing filters, without targeting a specific criterion other than Nyquist.

The step of selecting a candidate filter may further comprise selecting a candidate filter design defined in terms of a filter bank impulse response having a finite number of normalized (by the largest value) frequency coefficients having a substantially non-zero value when projected on a time and frequency grid with half symbol period and subcarrier spacing as time and frequency components respectively. The threshold below which a normalized coefficient may be considered to be substantially zero value will be recognized by the skilled person depending on the context of the application and design constraint. The range of non zero value will in any case lie above $1 \times 10^{-2}$, and may restricted down to $1 \times 10^{-3}$ or indeed to $1 \times 10^{-4}$. The threshold values are defined in such a way that the effect on the SIR is as low as possible. The acceptable level of SIR depends on the application and the considered candidate filter.

Where it is desired to define a filter having a short number of taps in the Frequency domain, since the frequency and time domains can be considered as dual domains and thanks to the property of the Fourier Transform that a filter spanning a large period of time generally spans a short interval in frequency, a filter can be designed in the frequency domain inspired by the ones already designed in the time domain with a large time intervals. Generally it will be desirable to have the shortest number of taps altogether. Three non-zero coefficient candidate filters such as the Martin-Mirabassi-Bellange with OF equals to 4 filter can give good results, 4, or 5 coefficient filters are also well suited. Candidate filters with a higher number of coefficient will result in the loss of the perfect reconstruction property (Nyquist no longer respected) and result in non-orthogonal FBMC/OQAM schemes. On the other hand, 1 coefficient results in a rectangular filter with poor frequency localization.

Alternatively, the candidate prototype filter can be designed from scratch using optimization methods to meet a time-frequency localization (TFL) criterion defined by the Heisenberg parameter:

$$\xi(g) = \frac{1}{4\pi\sqrt{\sigma_t(g)\sigma_f(g)}}, \tag{15}$$

where $\sigma_t(g)$ and $\sigma_f(g)$ are respectively the second order moments in time and frequency of the prototype filter g. The value of $\xi(g)$ is always between 0 and 1.

One design method consists of optimizing the filter coefficients in the frequency domain to fulfill the TFL and Nyquist criteria, for example according to a weighted-sum of near-adjacent IFT filters based techniques such as described in K. Martin, "Small side-lobe filter design for multitone data-communication applications," IEEE Transactions on Circuits and Systems II: Analog and Digital Signal Processing, vol. 45, no. 8, pp. 1155-1161, August 1998.

Another design method involves the optimization of filter coefficients using a compact representation by decomposing the impulse response of the filter into an angular-based representation of the corresponding polyphase network. This representation ensures that the Nyquist criterion is respected, and the angular parameters are optimized to meet the TFL criterion. This method is described in D. Pinchon, P. Siohan, and C. Siclet, "Design techniques for orthogonal Modulated filterbanks based on a compact representation," IEEE Transactions on Signal Processing, vol. 52, no. 6, pp. 1682-1692, June 2004.

Other design methods involve the Isotropic Orthogonal Transform Algorithm (IOTA) as described by B. le Floch, M. Alard, C. Berrou. in "Coded orthogonal frequency division multiplex". Proceedings of the IEEE, vol. 83, pp. 982-996, June 1995, or the Square Root Raised Cosine functions.

Filters developed according to the above principles are particularly suited for digital modulation schemes such as cyclic or linear convolution based communication systems, for example.

By way of examples of existing filters design that may give satisfactory results when taken as the candidate filter, the "Martin-Mirabassi-Bellange with OF equals to 4" (mmb4) filter as presented in B. Le Floch, M. Alard, and C. Berrou, "Coded orthogonal frequency division multiplex [TV broadcasting]," Proceedings of the IEEE, vol. 83, no. 6, pp. 982-996, June 1995. and K. Martin, "Small side-lobe filter design for multitone data communication, applications," IEEE Transactions on Circuits and Systems II: Analog and Digital Signal Processing, vol. 45, no. 8, pp. 1155-1161, August 1998, and considered for FBMC/OQAM during the PHYDYAS project are put forward.

The "Martin-Mirabassi-Bellange with OF equals to 4" filter is defined by the following impulse response of the filter bank in the time and frequency axis:

|  | t − 4 | t − 3 | t − 2 | t − 1 | t | t + 1 | t + 2 | t + 3 | t + 4 |
|---|---|---|---|---|---|---|---|---|---|
| f − 1 | 0.005 | j 0.043 | −0.125 | −j 0.206 | 0.239 | j 0.206 | −0.125 | −j 0.043 | 0.005 |
| f | 0 | −0.067 | 0 | 0.564 | 1 | 0.564 | 0 | −0.067 | 0 |
| f + 1 | 0.005 | −j 0.043 | −0.125 | j 0.206 | 0.239 | −j 0.206 | −0.125 | j 0.043 | 0.005 |

It may be noted that the filter bank impulse response of the resulting filter is highly localized in frequency since interference is limited only to one adjacent sub-carrier in the frequency plane.

It will be appreciated that this is merely one example of a particular candidate filter design which may be suitable for particular applications. In particular, this candidate filter design is suitable as a starting point for the design of filters for FBMC/OQAM architectures as described above. Other suitable candidate filter designs may also be found to satisfy selection criteria as discussed above, and provide the basis of new filter designs for this or other applications, such as;

- IOTA Filter as described in B. Le Floch, M. Alard, and C. Berrou, "Coded orthogonal frequency division multiplex [TV broadcasting]," Proceedings of the IEEE, vol. 83, no. 6, pp. 982-996, June 1995;
- FS 4 filter as described in D. Pinchon, P. Siohan, C. Siclet, Design techniques for orthogonal modulated filterbanks based on a compact representation, IEEE Trans. Signal Process. 52 (June (6)) (2004) 1682-1692; or
- MMB filter with OF superior to 4 as described in K. Martin, "Small side-lobe filter design for multitone data-communication applications," IEEE Transactions on Circuits Systems II: Analog and Digital Signal Processing, vol. 45, no. 8, pp. 1155-1161, August 1998.

Once the candidate filter design is selected, the method proceeds to step 302, at which the time and frequency coefficients of the impulse response of the filter bank defining the candidate filter design are inverted to define a further filter design.

Inverting the axes generates a prototype filter highly localized in time, with an overlapping factor equal to 1. The coefficients of the prototype filter can be deduced from the desired impulse response of the filter bank by transmitting an impulse equal to 1 at time slot t and sub-carrier f. Using the notations presented above, $$a_n(m)=1 \text{ if } n=t \text{ and } m=f, \text{ else } 0. \quad (16)$$

f and t can be arbitrary set to 0 to simplify calculations since the impulse response of the filter bank does not depend on the location of the transmitted impulse in the time and frequency plane. Thus, equation (1) becomes:

$$s(k)=g(k) \quad (17)$$

Then, the received samples after demodulation at time slot n=t=0 are expressed as follows:

$$c_0(k) = \sum_{i=0}^{M-1} g^2(i) e^{-j\frac{2\pi ki}{M}} \quad (18)$$

Thus, g can be deduced by setting $c_0(m)=C_{candidate}(m)$, where $C_{candidate}$ corresponds to the coefficients of the impulse response of the filter bank at line f in the impulse response of the candidate filter design, as shown above.

$$g(k) = \sqrt{\sum_{i=0}^{M-1} c_{candidate}(i) e^{j\frac{2\pi ki}{M}}} \quad (19)$$

Optionally, the design procedure may introduce simplifications to obtain a simpler analytical expression, by taking advantage of the real valued and symmetrical $C_{candidate}$ coefficients:

According to the above table, $c_{candidate}(2i)=0 \; \forall i \neq 0$ (column t-4, t-2, t+2 and t+4 at line f), and $c_{candidate}(0)=1$ (column t at line f). It is in reality applicable for any prototype filter, since it is a consequence of Nyquist criteria (see proof 1). Thus, $$g(k) = \sqrt{1 + \sum_{i=0}^{M/2-1} c_{candidate}(2i+1) e^{j\frac{2\pi k(2i+1)}{M}}} \quad (20)$$

Furthermore, $c_{candidate}(i)=c_{candidate}(-i)$, which is equivalent to $c_{candidate}(i)=c_{candidate}(M-i-1)$ by FFT shift (the FFT being periodic), because of the real valued nature of the prototype filter. Thus, assuming M is a power of 2 superior to 4 (which is always the case in practical implementation):

$$g(k) = \sqrt{1 + \sum_{i=0}^{M/4-1} c_{candidate}(2i+1) e^{j\frac{2\pi k(2i+1)}{M}} + \sum_{i=0}^{M/4-1} c_{candidate}\left(2i+1+\frac{M}{4}\right) e^{j\frac{2\pi k(2i+1+\frac{M}{4})}{M}}} \quad (21)$$

The second sum can also be written as follows:

$$g(k) = \sqrt{1 + \sum_{i=0}^{M/4-1} c_{candidate}(2i+1) e^{j\frac{2\pi k(2i+1)}{M}} + \sum_{i=0}^{M/4-1} c_{candidate}(M-(2i+1)) e^{j\frac{2\pi k(M-(2i+1))}{M}}} \quad (22)$$

$$g(k) = \sqrt{1 + \sum_{i=0}^{M/4-1} c_{candidate}(2i+1) e^{j\frac{2\pi k(2i+1)}{M}} + e^{j\frac{2\pi kM}{M}} \sum_{i=0}^{M/4-1} c_{candidate}(2i+1) e^{-j\frac{2\pi k(2i+1)}{M}}} \quad (23)$$

$$g(k) = \sqrt{1 + \sum_{i=0}^{M/4-1} c_{candidate}(2i+1) \left( e^{j\frac{2\pi k(2i+1)}{M}} + e^{-j\frac{2\pi k(2i+1)}{M}} \right)} \quad (24)$$

Using Euler's formula:

$$g(k) = \sqrt{1 + 2\sum_{i=0}^{M/4-1} c_{candidate}(2i+1) \cos\left(\frac{2\pi k(2i+1)}{M}\right)} \quad (25)$$

Defining $P_g(i)=-c_{candidate}(2i+1)$:

$$g(k) = \sqrt{1 - 2\sum_{i=0}^{M/4-1} P_g(i) \cos\left(\frac{2\pi k(2i+1)}{M}\right)} \quad (26)$$

In the case of Martin-Mirabassi-Bellange with OF equals to 4 as discussed hereafter, $P_g(i)=0 \; \forall i>2$, thus:

$$g(k) = \sqrt{1 - 2\sum_{i=0}^{2} P_g(i)\cos\left(\frac{2\pi k(2i+1)}{M}\right)} \quad (27)$$

Proof 1:
To respect the Nyquist criteria, the prototype filter must fulfill the following condition:

$$\sum_{i=0}^{2q-1} g^2\left(k + i\frac{M}{2}\right) = 1 \,\forall\, k \quad (28)$$

To recall, the impulse response of the filter bank at time index t=0 is:

$$c_0(k) = \sum_{i=0}^{M-1} g^2(i) e^{-j\frac{2\pi ki}{M}} \quad (29)$$

It can also be expressed by decomposing the FFT into 2q terms:

$$c_0(k) = \sum_{i=0}^{2q-1} \sum_{j=0}^{M/(2q)-1} g^2\left(j + i\frac{M}{2}\right) e^{-j\frac{2\pi k(j+i\frac{M}{2})}{M}} \quad (30)$$

$$c_0(k) = \sum_{j=0}^{M/(2q)-1} \left[\sum_{i=0}^{2q-1} g^2\left(j + i\frac{M}{2}\right)(-1)^{ki}\right] e^{-j\frac{2\pi kj}{M}} \quad (31)$$

For k even:

$$c_0(2k) = \sum_{j=0}^{M/(2q)-1} \left[\sum_{i=0}^{2q-1} g^2\left(j + i\frac{M}{2}\right)\right] e^{-j\frac{2\pi kj}{M}} \quad (32)$$

$$c_0(2k) = \sum_{j=0}^{M/(2q)-1} [1] e^{-j\frac{2\pi kj}{M}} \quad (33)$$

$$c_0(2k) = \delta(k) \quad (34)$$

The impulse response is constructed by inverting t and f axis. The following table is the impulse response of the filter bank (analysis+synthesis filter, i.e. the combined effect of the TX and RX filter), using the obtained prototype filter.

|  | f − 4 | f − 3 | f − 2 | f − 1 | f | f + 1 | f + 2 | f + 3 | f + 4 |
|---|---|---|---|---|---|---|---|---|---|
| t − 1 | 0.005 | j 0.043 | −0.125 | −j 0.206 | 0.239 | j 0.206 | −0.125 | −j 0.043 | 0.005 |
| t | 0 | −0.067 | 0 | 0.564 | 1 | 0.564 | 0 | −0.067 | 0 |
| t + 1 | 0.005 | −j 0.043 | −0.125 | j 0.206 | 0.239 | −j 0.206 | −0.125 | j 0.043 | 0.005 |

The impulse response of the prototype filter is defined as g(k). The process of decomposition performed by the filter bank is called synthesis (meaning analysis of the signal in terms of its components in each sub-band); the output of synthesis is referred to as a sub-band signal with as many sub-bands as there are filters in the filter bank. The reconstruction process is called analysis, meaning reconstitution of a complete signal resulting from the filtering process. The Nyquist criteria is verified after the combined effect of the synthesis and analysis filters, i.e. at the output of the synthesis filter (RX side).

The method then proceeds to step 303 at which the resulting frequency response defining the further filter design is truncated to the minimum number of coefficients achieving the specified signal to interference ratio.

By truncating the frequency response of the prototype filter at the receiver side, interference may appear due to a non-perfect reconstruction, resulting in a performance degradation. However, if CG, the number of non-zero coefficients, is too high, the resulting Frequency Spread implementation will require important computational and hardware complexities.

While the number of non-zero coefficients in the frequency plane axis of the filter-bank impulse response will often need to be 3 or 5 to obtain a filter with near perfect reconstruction proprieties, the overlapping factor will constrain the frequency localization of the target filter. If the candidate has poor time localization, then the target filter will have a poor frequency localization. For a good compromise between time/frequency localization, OF=3, 4, 5 are often found to be satisfactory.

As such there is provided a digital filter with a target overlapping factor and meeting a specified signal to interference ratio, said filter being defined by the coefficients of the inverted time and frequency coefficients of the filter bank impulse response defining a candidate filter design satisfying the Nyquist criterion and having an overlapping factor higher than the target.

In some cases, there is provided a digital filter with an overlapping factor of 1, said filter being defined by the coefficients of the inverted time and frequency coefficients of the filter bank impulse response of the Martin-Mirabassi-Bellange with OF equals to 4 candidate filter.

As such, the set of coefficients presented in the preceding table thus defines one particular design in accordance with an embodiment (i.e. with limited truncation), which may prove effective in certain situations, in particular in FBMC implementations targeting low complexity air interfaces such as the 5G air interface.

Figure 5:
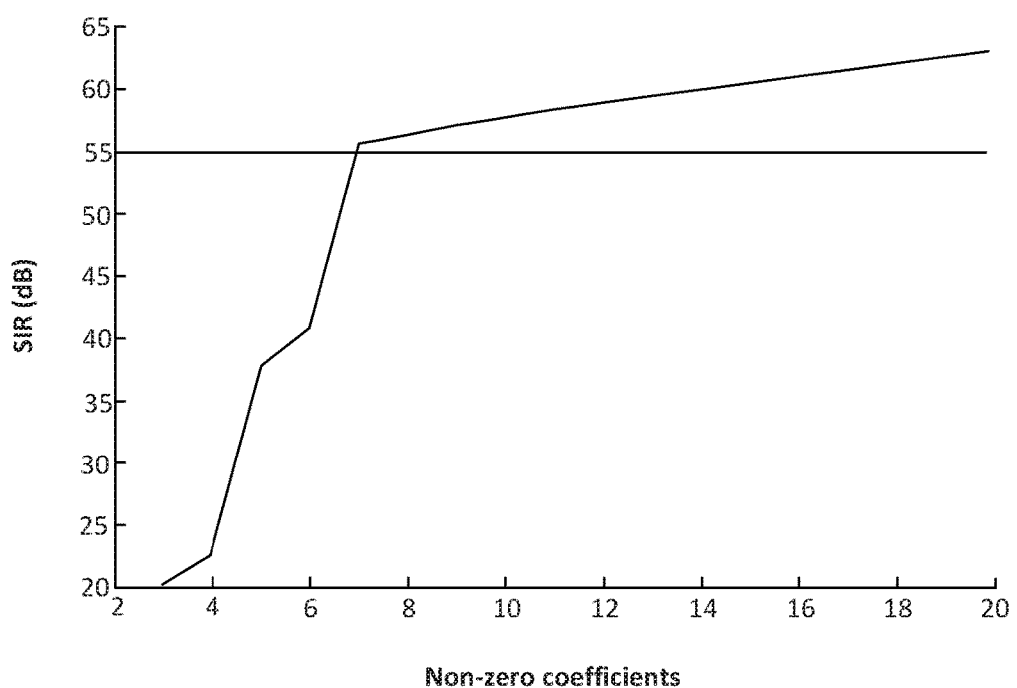
FIG. 5 shows a possible relationship between the number of coefficients in a filter design and the specified signal to interference ratio attained.

FIG. 5 shows a possible relationship between the number of coefficients in a filter design and the specified signal to interference ratio attained. As shown, the Signal to Interference performance of the filter described with reference to FIG. 3 above is plotted against the number of coefficients retained after truncation at step 303. On this basis, it can be seen that if for example a minimum signal to interference ratio of 55 dB is specified, a final filter design having 7 non-zero coefficients is sufficient.

On this basis, the requisite number of coefficients can be selected, and the frequency response of the further filter design is truncated to that number as mentioned with reference to step 303 above, to arrive at a set of coefficients as follows:

For example,
G(−3)=0.0107
G(−2)=−0.0837
G(−1)=−0.4202
G(0)=1
G(1)=−0.4202
G(2)=−0.0837
G(3)=0.0107
where G represents the discrete Fourier transform of the impulse response of the prototype filter g, defined as:

$$G(m) = \sum_{k=0}^{M-1} g(k) e^{\frac{-i2\pi km}{M}} \quad (35)$$

The truncated frequency response of the filter is obtained by setting:

$$G(m) = 0 \text{ for } m \notin [-\Delta, \Delta] \text{ and } \Delta = \frac{C_g - 1}{2}, \quad (36)$$

where $C_g$ is the odd valued number of required non-truncated coefficients to reach the target SIR ($C_g$=7 in this example for a SIR of 55 dB).

If $C_g$ is even valued, (37)

$$\Delta = \frac{C_g}{2} \text{ with } m \notin [-\Delta, \Delta - 1] \text{ or } m \notin [-\Delta + 1, \Delta]$$

These two previous definitions for m are possible and lead to the same SIR. In practice, a better compromise between complexity and SIR can be achieved if the coefficients of the frequency response remain symmetrical, i.e. when $C_g$ is odd valued.

The resulting filter has similar desirable characteristics to the original candidate filter design for example in terms of filter complexity and performance, whilst being highly localized in the time domain and there achieving the benefits associated with short filters for example as discussed in the context of FBMC/OQAM systems above. Such filters are equally applicable in other communications systems, in particular others based on or linear convolution, such as FBMC/QAM transceiver. For example, Filtered Multi-Tone (FMT) modulation is a particular filter-bank multicarrier modulation (with linear convolution) which transmits data at data rate lower than the Nyquist rate. It corresponds to the case where the number of channel (M) is inferior to the upsampling factor (N) for the analysis and synthesis filter of the filter-bank multicarrier system. Another set of alternatives is constituted by systems which use a circular convolution such as Cyclic-block FMT is the FMT modulation where the synthesis and analysis filter uses a circular convolution instead of the linear convolution.

Figure 1:
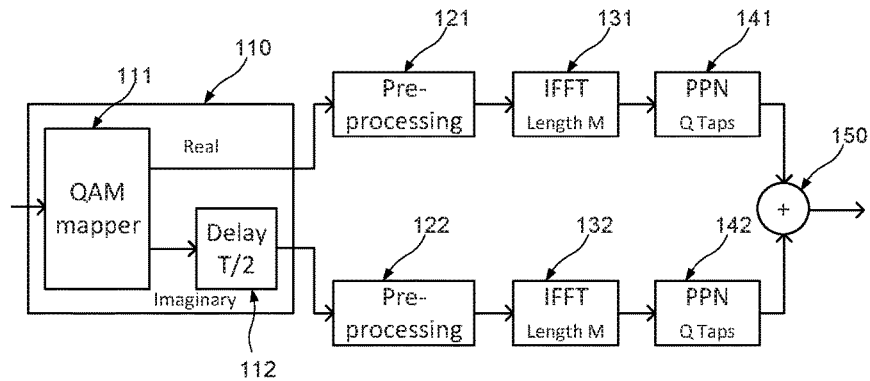
FIG. 1 shows a PPN FBMC/OQAM transmitter implementation.
Figure 2A:
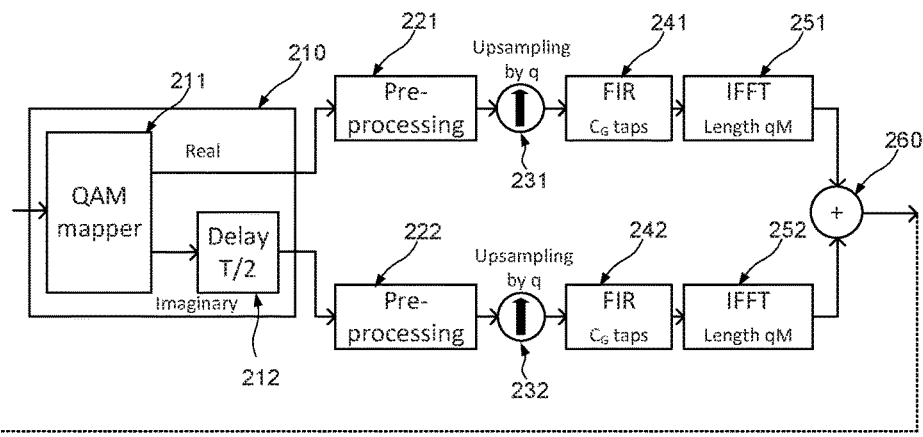
FIG. 2a shows an FS FBMC/OQAM transmitter implementation.
Figure 2B:
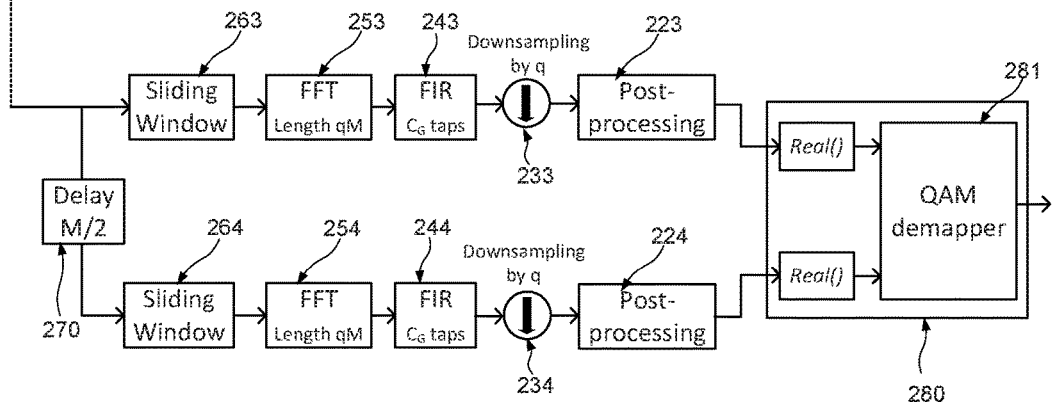
FIG. 2b shows an FS FBMC/OQAM receiver implementation.

Filters designed in this way may be incorporated in transmitters and/or corresponding receivers, for example in the place of the filters 131, 132, 241, 242, 243, 244 described above with respect to FIGS. 1 and 2.

Accordingly, there is defined a digital filter with a target overlapping factor and meeting a specified signal to interference ratio, said filter being defined by a truncation of the coefficients of the inverted time and frequency coefficients of the filter bank impulse response defining a candidate filter design satisfying the Nyquist criterion and having an overlapping factor higher than the target.

The implementation of the filter depends on the FBMC architecture.

For PPN-based implementation, the filter is used as a window function, thus it is simply a multiplication of the coefficients at the input of the FFT at the receiver side. For this implementation, the non-truncated version may be used with no change in complexity.

For Frequency Spread-based implementation, the filter is implemented as a discrete-time FIR filter, after FFT on the receiver side. The truncated version may be used to reduce complexity.

A PPN implementation may be adopted at the transmitter side and a Frequency Spread implementation at receiver side. Other implementation details and variants of these methods may be envisaged, in particular corresponding to the variants of the apparatus described with reference to the preceding drawings.

The disclosed methods can take form of an entirely hardware embodiment (e.g. FPGA), an entirely software embodiment (for example to control a system according to the invention) or an embodiment containing both hardware and software elements. Software embodiments include but are not limited to firmware, resident software, microcode, etc. The invention can take the form of a computer program product accessible from a computer-usable or computer-readable medium providing program code for use by or in connection with a computer or an instruction execution system. A computer-usable or computer-readable can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium.

These methods and processes may be implemented by means of computer-application programs or services, an application-programming interface (API), a library, and/or other computer-program product, or any combination of such entities.

Figure 6:
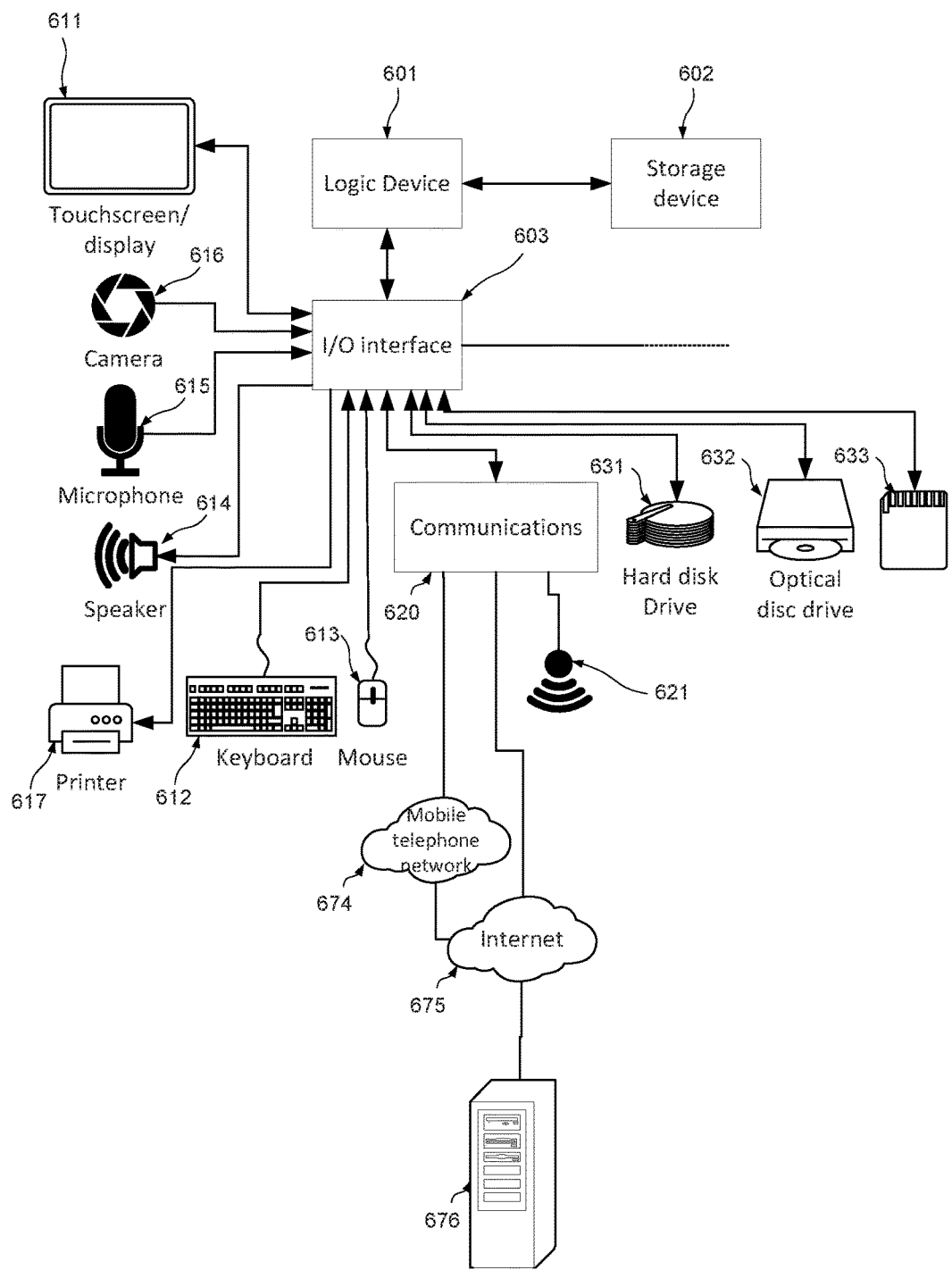
FIG. 6 shows a generic computing system suitable for implementation of embodiments of the invention.

FIG. 6 shows a generic computing system suitable for implementation of embodiments of the invention.

A shown in FIG. 6, a system includes a logic device 601 and a storage device 602. The system may optionally include a display subsystem 611, input subsystem 612, 613, 615, communication subsystem 620, and/or other components not shown.

Logic device 601 includes one or more physical devices configured to execute instructions. For example, the logic device 601 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic device 601 may include one or more processors configured to execute software instructions. Additionally or alternatively, the logic device may include one or more hardware or firmware logic devices configured to execute hardware or firmware instructions. Processors of the logic device may be single-core or multi-core, and the instructions executed thereon may be configured for sequential, parallel, and/or distributed processing. Individual components of the logic device 601 optionally may be distributed among two or more separate devices, which may be remotely located and/or configured for coordinated processing. Aspects of the logic device 601 may be virtualized and executed by remotely accessible, networked computing devices configured in a cloud-computing configuration.

Storage device 602 includes one or more physical devices configured to hold instructions executable by the logic device to implement the methods and processes described herein. When such methods and processes are implemented, the state of storage 602 device may be transformed—e.g., to hold different data.

Storage device 602 may include removable and/or built-in devices. Storage device 602 may comprise one or more types of storage device including optical memory (e.g., CD, DVD, HD-DVD, Blu-Ray Disc, etc.), semiconductor memory (e.g., FLASH, RAM, EPROM, EEPROM, etc.), and/or magnetic memory (e.g., hard-disk drive, floppy-disk drive, tape drive, MRAM, etc.), among others. Storage device may include volatile, nonvolatile, dynamic, static, read/write, read-only, random-access, sequential-access, location-addressable, file-addressable, and/or content-addressable devices.

In certain arrangements, the system may comprise an interface 603 adapted to support communications between the Logic device 601 and further system components. For example, additional system components may comprise removable and/or built-in extended storage devices. Extended storage devices may comprise one or more types of storage device including optical memory 632 (e.g., CD, DVD, HD-DVD, Blu-Ray Disc, etc.), semiconductor memory 633 (e.g., RAM, EPROM, EEPROM, FLASH etc.), and/or magnetic memory 631 (e.g., hard-disk drive, floppy-disk drive, tape drive, MRAM, etc.), among others. Such extended storage device may include volatile, nonvolatile, dynamic, static, read/write, read-only, random-access, sequential-access, location-addressable, file-addressable, and/or content-addressable devices.

It will be appreciated that storage device includes one or more physical devices, and excludes propagating signals per se. However, aspects of the instructions described herein alternatively may be propagated by a communication medium (e.g., an electromagnetic signal, an optical signal, etc.), as opposed to being stored on a storage device.

Aspects of logic device 601 and storage device 602 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system implemented to perform a particular function. In some cases, a program may be instantiated via logic device executing machine-readable instructions held by storage device. It will be understood that different modules may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

In particular, the system of FIG. 6 may be used to implement embodiments of the invention.

For example a program implementing the steps described with respect to FIG. 3 may be stored in storage device 602 and executed by logic device 601. The candidate filter design may be buffered in the storage device 602. The Logic device 601 may implement the inversion and truncation steps as described above under the control of a suitable program, or may interface with internal or external dedicated systems adapted to perform some or all of these processes such as hardware accelerated encoders/decoders and the like. Furthermore, a program may implement a transmitter or receiver implementing an encoder or decoder in accordance with embodiments for example as described above. These tasks may be shared among a number of computing devices, for example as described with reference to FIG. 6. The encoded signal may then be output via the communications interface 620 for transmission in a transmitter embodiment, or the encoded signal may then input via the communications interface 620 for decoding in a receiver embodiment.

Accordingly the invention may be embodied in the form of a computer program.

It will be appreciated that a "service", as used herein, is an application program executable across multiple user sessions. A service may be available to one or more system components, programs, and/or other services. In some implementations, a service may run on one or more server-computing devices.

When included, display subsystem 611 may be used to present a visual representation of the first video stream, the second video stream or the combined video stream, or may otherwise present statistical information concerning the processes undertaken. As the herein described methods and processes change the data held by the storage device 602, and thus transform the state of the storage device 602, the state of display subsystem 611 may likewise be transformed to visually represent changes in the underlying data. Display subsystem 611 may include one or more display devices utilizing virtually any type of technology. Such display devices may be combined with logic device and/or storage device in a shared enclosure, or such display devices may be peripheral display devices.

When included, input subsystem may comprise or interface with one or more user-input devices such as a keyboard 612, mouse 613, touch screen 611, or game controller (not shown). In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 620 may be configured to communicatively couple computing system with one or more other computing devices. For example, communication module of may communicatively couple computing device to remote service hosted for example on a remote server 676 via a network of any size including for example a personal area network, local area network, wide area network, or the internet. Communication subsystem may include wired and/or wireless communication devices compatible with one or more different communication protocols. As non-limiting examples, the communication subsystem may be configured for communication via a wireless telephone network 674, or a wired or wireless local- or wide-area network. In some embodiments, the communication subsystem may allow computing system to send and/or receive messages to and/or from other devices via a network such as the Internet 675. The communications subsystem may additionally support short range inductive communications 621 with passive devices (NFC, RFID etc).

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method of designing a digital filter with a target overlapping factor meeting a specified signal to interference ratio, said method comprising:
   selecting a candidate filter design defined by a filter bank impulse response, satisfying the Nyquist criterion and having an overlapping factor higher than the target;
   inverting time and frequency coefficients of said filter bank impulse response to define a further filter design; and
   truncating a frequency response defining said further filter design to a minimum number of coefficients achieving said specified signal to interference ratio.

2. The method of claim 1, wherein said selecting a candidate filter further comprises selecting a candidate filter design defined in terms of a filter bank impulse response having a finite number of frequency coefficients having a value greater that $1 \times 10^{-2}$ when projected on a time and frequency grid with half symbol period and subcarrier spacing as time and frequency components respectively.

3. The method of claim 2, wherein said candidate filter design is a "Martin-Mirabassi-Bellange" design with an overlapping factor of 3 to 8 inclusive.

4. The method of claim 3, wherein said defining a candidate filter comprises using either an Isotropic Orthogonal Transform Algorithm or a Square Root Raise Cosine functions.

5. The method of claim 1, wherein said defining a candidate filter comprises using techniques of weighted-sum of near-adjacent inverse Fast Fourier Transform filters.

6. The method of claim 1, wherein said defining a candidate filter comprises using a compact representation by decomposing the impulse response of the filter into an angular-based representation of the corresponding polyphase network.

7. The method of claim 1, wherein the target overlapping factor of said digital filter is larger than 1.

8. The method of claim 1, wherein said candidate filter design has 3 frequency coefficients having a value greater that $1 \times 10^{-2}$.

9. The method of claim 1, wherein said candidate filter design has 5 frequency coefficients having a value greater that $1 \times 10^{-2}$.

10. A digital filter with a target overlapping factor and meeting a specified signal to interference ratio, defined in accordance with the method of claim 1.

11. A digital filter with a target overlapping factor and meeting a specified signal to interference ratio, said filter being defined by coefficients of inverted time and frequency coefficients of the filter bank impulse response defining a candidate filter design satisfying the Nyquist criterion and having an overlapping factor higher than the target.

12. A transmitter implementing cyclic or linear convolution using the digital filter of claim 11.

13. The transmitter of claim 12, wherein said transmitter implements a Filter-Bank Multi-Carrier with Offset Quadrature Modulation.

14. A receiver implementing cyclic or linear convolution using the digital filter of claim 11.

15. The receiver of claim 14, wherein said receiver implements a Filter-Bank Multi-Carrier with Offset Quadrature Amplitude Modulation demodulation.

* * * * *